United States Patent
Tsai et al.

(10) Patent No.: US 11,818,912 B2
(45) Date of Patent: Nov. 14, 2023

(54) ORGANIC LIGHT-EMITTING DIODE DISPLAY PANELS WITH MOISTURE BLOCKING STRUCTURES

(71) Applicant: Apple Inc., Cupertino, CA (US)

(72) Inventors: Tsung-Ting Tsai, Cupertino, CA (US); Abbas Jamshidi Roudbari, San Jose, CA (US); Chuan-Sheng Wei, Taoyuan (TW); HanChi Ting, New Taipei (TW); Jae Won Choi, San Jose, CA (US); Jianhong Lin, Taoyuan (TW); Nai-Chih Kao, Taoyuan (TW); Shih Chang Chang, Cupertino, CA (US); Shin-Hung Yeh, Taipei (TW); Takahide Ishii, Taoyuan (TW); Ting-Kuo Chang, San Jose, CA (US); Yu Hung Chen, Taoyuan (TW); Yu-Wen Liu, Hsinchu (TW); Yu-Chuan Pai, Zhubei (TW); Andrew Lin, Milpitas, CA (US)

(73) Assignee: Apple Inc., Cupertino, CA (US)

( * ) Notice: Subject to any disclaimer, the term of this patent is extended or adjusted under 35 U.S.C. 154(b) by 321 days.

(21) Appl. No.: 16/670,071

(22) Filed: Oct. 31, 2019

(65) Prior Publication Data
US 2020/0220098 A1 Jul. 9, 2020

Related U.S. Application Data

(60) Provisional application No. 62/788,562, filed on Jan. 4, 2019.

(51) Int. Cl.
*H10K 50/84* (2023.01)
*H10K 71/00* (2023.01)
(Continued)

(52) U.S. Cl.
CPC ........... *H10K 50/841* (2023.02); *H10K 59/12* (2023.02); *H10K 71/00* (2023.02); *H10K 71/18* (2023.02);
(Continued)

(58) Field of Classification Search
CPC ... H01L 51/5237–525; H01L 2251/105; H01L 27/3246; H01L 27/3258;
(Continued)

(56) References Cited

U.S. PATENT DOCUMENTS 6,724,150 B2   4/2004   Maruyama et al.
6,888,307 B2   5/2005   Silvernail et al.
(Continued)

OTHER PUBLICATIONS

Chih Jen Yang et al., U.S. Appl. No. 16/000,725, filed Jun. 5, 2018.

*Primary Examiner* — Maliheh Malek
(74) *Attorney, Agent, or Firm* — Treyz Law Group, P.C.; Tianyi He (57) ABSTRACT

A display may have organic light-emitting diode pixels formed from thin-film circuitry. The thin-film circuitry may be formed in thin-film transistor (TFT) layers and the organic light-emitting diodes may include anodes and cathodes and an organic emissive layer formed over the TFT layers between the anodes and cathodes. The organic emissive layer may be formed via chemical evaporation techniques. The display may include moisture blocking structures such as organic emissive layer disconnecting structures that introduce one or more gaps in the organic emissive layer during evaporation so that any potential moisture permeating path from the display panel edge to the active area of the display is completely terminated.

19 Claims, 11 Drawing Sheets

(51) Int. Cl.
*H10K 71/18* (2023.01)
*H10K 59/12* (2023.01)
*H10K 59/124* (2023.01)

(52) U.S. Cl.
CPC ......... *H10K 59/124* (2023.02); *H10K 71/821* (2023.02)

(58) Field of Classification Search
CPC ............... H01L 27/124; H01L 27/1248; H01L 27/1255; H01L 29/7869; H01L 27/1218; H01L 27/1214; H01L 27/1222; H01L 27/1259; H01L 27/1288; H01L 27/1244; H01L 29/78675; H01L 29/4908; H01L 29/78618; H01L 29/78633; H01L 27/12; H01L 29/786; H01L 27/1266; H01L 29/66757; H01L 29/78606; H01L 27/1251; H01L 29/42384; H01L 29/66969; H01L 29/78696; H01L 33/58; H01L 33/507; H01L 27/1262; H01L 29/41733; H01L 27/1237; H01L 27/156; H01L 2924/12044; H01L 25/0753; H01L 29/78603; H01L 21/77; H01L 25/167; H01L 29/45; H01L 27/127; H01L 21/0274; H01L 27/1285; H01L 27/1296; H01L 29/7866; H01L 29/78672; H01L 29/78678; H01L 27/14678; H01L 27/15; H01L 28/60; H01L 29/24; H01L 29/78645; H01L 29/78648; H01L 27/1229; H01L 29/66742; H01L 29/78621; H01L 29/78693; H01L 33/62; H01L 21/02554; H01L 24/05; H01L 27/1233; H01L 27/1274; H01L 29/42364; H01L 2924/00; H01L 2924/13069; H01L 21/268; H01L 22/12; H01L 2224/05552; H01L 2224/05556; H01L 27/13; H01L 29/78627; H01L 2924/0002; H01L 2924/15788; H01L 33/20; H01L 2029/42388; H01L 21/02065; H01L 21/02118; H01L 21/02532; H01L 21/02631; H01L 21/0273; H01L 21/6715; H01L 21/76894; H01L 22/20; H01L 2224/05166; H01L 28/75; H01L 29/12; H01L 29/458; H01L 29/66765; H01L 29/78; H01L 29/78624; H01L 33/32; H01L 33/38; H01L 33/44; H01L 2021/60277; H01L 2021/775; H01L 21/02054; H01L 21/02063; H01L 21/02422; H01L 21/02488; H01L 21/02565; H01L 21/02595; H01L 21/02678; H01L 21/02683; H01L 21/02686; H01L 21/027; H01L 21/28088; H01L 21/311; H01L 21/31111; H01L 21/31127; H01L 21/32055; H01L 21/3212; H01L 21/32133; H01L 21/32139; H01L 21/32155; H01L 21/50; H01L 21/56; H01L 21/67011; H01L 21/67017; H01L 21/82; H01L 21/84; H01L 22/10; H01L 2221/68363; H01L 2224/05073; H01L 2224/0518; H01L 2224/05647; H01L 23/145; H01L 23/522; H01L 23/5385; H01L 23/5387; H01L 23/62; H01L 25/0655; H01L 27/14623; H01L 27/14636; H01L 29/045; H01L 29/0847; H01L 29/16; H01L 9/167; H01L 29/78636; H01L 29/78642; H01L 29/78651; H01L 29/78669; H01L 2924/00012; H01L 2924/01047; H01L 2924/0132; H01L 2933/0016; H01L 2933/0066; H01L 2933/0091; H01L 33/005; H01L 33/08; H01L 33/52; H01L 2029/7863; H01L 21/02046; H01L 21/0217; H01L 21/02205; H01L 21/02225; H01L 21/02252; H01L 21/02255; H01L 21/02274; H01L 21/02381; H01L 21/0242; H01L 21/02425; H01L 21/02491; H01L 21/02502; H01L 21/02505; H01L 21/02592; H01L 21/0262; H01L 21/02667; H01L 21/02672; H01L 21/02675; H01L 21/02691; H01L 21/2026; H01L 21/26513; H01L 21/266; H01L 21/28; H01L 21/28017; H01L 21/30604; H01L 21/31051; H01L 21/314; H01L 21/3141; H01L 21/3143; H01L 21/31616; H01L 21/3165; H01L 21/318; H01L 21/32134; H01L 21/3221; H01L 21/324; H01L 21/76251; H01L 21/764; H01L 21/76804; H01L 21/76805; H01L 21/76829; H01L 21/7688; H01L 21/8238; H01L 22/32; H01L 2221/68359; H01L 2221/68368; H01L 2224/0508; H01L 2224/05124; H01L 2224/0558; H01L 2224/16227; H01L 2224/32225; H01L 2224/73204; H01L 2224/81903; H01L 2224/83204; H01L 2224/83365; H01L 2224/83851; H01L 2224/83862; H01L 2224/83907; H01L 23/291; H01L 23/3171; H01L 23/485; H01L 23/4855; H01L 23/49894; H01L 23/535; H01L 23/562; H01L 24/09; H01L 24/28; H01L 25/162; H01L 25/18; H01L 27/02; H01L 27/0207; H01L 27/0266; H01L 27/0288; H01L 27/0296; H01L 27/0705; H01L 27/1206; H01L 27/1277; H01L 27/1281; H01L 27/144; H01L 27/146; H01L 27/14603; H01L 27/14609; H01L 27/14612; H01L 27/14616; H01L 27/14625; H01L 27/1463; H01L 27/14634; H01L 27/14646; H01L 27/14818; H01L 28/20; H01L 29/04; H01L 29/06; H01L 29/0603; H01L 29/0657; H01L 29/105; H01L 29/1054; H01L 29/227; H01L 29/247; H01L 29/41741; H01L 29/41783; H01L 29/423; H01L 29/42312; H01L 29/42356; H01L 29/42372; H01L 29/42376; H01L 29/43; H01L 29/49; H01L 29/495; H01L 29/4958; H01L 29/4966; H01L 29/513; H01L 29/517; H01L 29/06615; H01L 29/6656; H01L 26/66575; H01L 29/66696; H01L 29/6675; H01L 29/66772; H01L 29/66787; H01L 29/66795; H01L 29/7842; H01L 29/7849; H01L 29/7855; H01L 29/78615; H01L 29/78654; H01L 29/78657; H01L 29/78663; H01L 29/78666; H01L 29/78681; H01L 29/78684; H01L 2924/01042; H01L 2924/12043; H01L 2924/15151; H01L 2924/3641; H01L 2933/005; H01L 2933/0058; H01L 31/1129; H01L 31/1136; H01L 33/0041;
H01L 33/16; H01L 33/36; H01L 33/382;
H01L 33/50; H01L 33/501; H01L 33/502;
H01L 33/504; H01L 33/505; H01L 33/54;
H01L 33/56; H01L 33/60; H10K 50/841;
H10K 71/00; H10K 71/18; H10K 71/821;
H10K 50/11; H10K 59/87; H10K 59/124;
H10K 59/122; H10K 59/12; H10K 59/1201

See application file for complete search history.

(56) References Cited

U.S. PATENT DOCUMENTS

| | | | |
|---|---|---|---|
| 7,316,756 B2 | 1/2008 | Boroson | |
| 7,931,516 B2 | 4/2011 | Aota | |
| 9,224,824 B2 * | 12/2015 | Watanabe | H01L 27/124 |
| 9,614,183 B2 * | 4/2017 | Zhang | H10K 50/844 |
| 10,084,155 B2 | 9/2018 | Cui | |
| 10,431,771 B2 | 10/2019 | Park et al. | |
| 10,483,335 B2 | 11/2019 | Bang et al. | |
| 10,872,932 B2 * | 12/2020 | Shi | H01L 27/3227 |
| 10,991,906 B2 * | 4/2021 | Ohta | H01L 51/5256 |
| 11,222,938 B2 * | 1/2022 | Kim | H01L 51/0097 |
| 11,309,517 B2 * | 4/2022 | Seo | H01L 51/0096 |
| 11,456,437 B2 * | 9/2022 | Kim | H01L 51/5253 |
| 2010/0118408 A1 * | 5/2010 | Lee | H01L 51/5275 359/640 |
| 2013/0002690 A1 * | 1/2013 | Ichinose | H01L 51/5275 345/522 |
| 2013/0069067 A1 * | 3/2013 | Youn | H01L 27/3246 438/34 |
| 2014/0077340 A1 * | 3/2014 | Wang | H01L 21/02107 257/618 |
| 2014/0131683 A1 * | 5/2014 | Kim | H01L 51/5253 438/22 |
| 2015/0187894 A1 * | 7/2015 | Watanabe | H01L 29/45 257/43 |
| 2015/0333293 A1 * | 11/2015 | Poon | H01L 51/5253 438/26 |
| 2015/0379921 A1 | 12/2015 | Lee et al. | |
| 2016/0190389 A1 * | 6/2016 | Lee | H01L 51/0097 438/28 |
| 2016/0204373 A1 | 7/2016 | Park | |
| 2016/0315284 A1 | 10/2016 | Jeon | |
| 2017/0003526 A1 * | 1/2017 | Jamshidi Roudbari | G02F 1/1339 |
| 2017/0005155 A1 | 1/2017 | You et al. | |
| 2017/0040392 A1 * | 2/2017 | Wang | H01L 23/564 |
| 2017/0047544 A1 * | 2/2017 | Kang | H01L 51/56 |
| 2017/0141236 A1 * | 5/2017 | Wu | H01L 27/1288 |
| 2017/0148856 A1 * | 5/2017 | Choi | H01L 27/3258 |
| 2017/0194601 A1 * | 7/2017 | Kokame | H01L 51/5259 |
| 2017/0279079 A1 | 9/2017 | Kim et al. | |
| 2017/0345881 A1 | 11/2017 | Kim et al. | |
| 2018/0097198 A1 * | 4/2018 | Chou et al. | |
| 2018/0123088 A1 * | 5/2018 | Kim | H01L 51/5253 |
| 2018/0151643 A1 * | 5/2018 | Lee | H01L 51/5012 |
| 2018/0151647 A1 * | 5/2018 | Lee | H01L 27/124 |
| 2018/0151822 A1 * | 5/2018 | Kim | H01L 51/5203 |
| 2018/0190947 A1 * | 7/2018 | Song | H01L 51/5203 |
| 2019/0164995 A1 * | 5/2019 | Lee | H01L 27/1262 |
| 2019/0165312 A1 * | 5/2019 | Bae | H01L 51/5246 |
| 2019/0207160 A1 * | 7/2019 | Wang | H10K 50/8445 |
| 2019/0213379 A1 | 7/2019 | Zhao et al. | |
| 2019/0245159 A1 * | 8/2019 | Kim | H01L 51/5246 |
| 2019/0312095 A1 * | 10/2019 | Park | H05K 1/113 |
| 2019/0312228 A1 * | 10/2019 | Sonoda | H01L 51/5253 |
| 2019/0326553 A1 * | 10/2019 | Abe | G09F 9/00 |
| 2019/0334120 A1 * | 10/2019 | Seo | H01L 51/5253 |
| 2019/0355930 A1 * | 11/2019 | Lee | H01L 51/5256 |
| 2019/0363146 A1 * | 11/2019 | Takahashi | H01L 51/5246 |
| 2019/0393443 A1 * | 12/2019 | Chen | H01L 51/0097 |
| 2020/0006697 A1 * | 1/2020 | Jung | H01L 27/3246 |
| 2020/0006702 A1 * | 1/2020 | Sonoda | G09F 9/30 |
| 2020/0052054 A1 * | 2/2020 | Park | H01L 27/3225 |
| 2020/0083475 A1 * | 3/2020 | Kang | H10K 59/131 |
| 2020/0091459 A1 * | 3/2020 | Senoo | H01L 27/3258 |
| 2020/0119126 A1 * | 4/2020 | Jo | H01L 27/3262 |
| 2020/0144535 A1 * | 5/2020 | Kim | H01L 51/5246 |
| 2020/0194510 A1 * | 6/2020 | Shin | H01L 27/3246 |
| 2020/0194721 A1 * | 6/2020 | Lee | G06F 3/0412 |
| 2020/0227675 A9 * | 7/2020 | Wang | H10K 50/8445 |
| 2020/0303479 A1 * | 9/2020 | Kim | G09G 3/3225 |
| 2020/0357871 A1 * | 11/2020 | Chung | H01L 27/3227 |
| 2021/0020733 A1 * | 1/2021 | Saida | H01L 27/3276 |
| 2021/0028249 A1 * | 1/2021 | Ding | H01L 27/3218 |
| 2021/0210583 A1 * | 7/2021 | Okabe | G09F 9/00 |
| 2021/0273026 A1 * | 9/2021 | Seo | H01L 51/56 |
| 2021/0273029 A1 * | 9/2021 | Bang | H01L 51/5253 |
| 2021/0296425 A1 * | 9/2021 | Ochi | H01L 27/3276 |
| 2021/0336209 A1 * | 10/2021 | Dong | H01L 51/56 |
| 2021/0351252 A1 * | 11/2021 | Koike | H01L 27/3246 |
| 2021/0351378 A1 * | 11/2021 | Lee | H01L 51/5253 |
| 2021/0359051 A1 * | 11/2021 | Jin | H01L 27/323 |
| 2021/0367199 A1 * | 11/2021 | Li | H01L 51/56 |
| 2021/0376281 A1 * | 12/2021 | Kim | H10K 59/122 |
| 2022/0052293 A1 * | 2/2022 | Hirase | H01L 51/5228 |
| 2022/0181582 A1 * | 6/2022 | Nomiyama | H01L 51/56 |
| 2022/0190290 A1 * | 6/2022 | Ochi | H01L 27/326 |
| 2022/0208875 A1 * | 6/2022 | Han | H01L 27/3276 |
| 2022/0223666 A1 * | 7/2022 | Kim | H01L 51/5253 |
| 2022/0320465 A1 * | 10/2022 | Hou | H01L 51/0097 |
| 2022/0367432 A1 * | 11/2022 | Xia | H01L 27/124 |
| 2022/0367772 A1 * | 11/2022 | Oh | H10K 59/121 |
| 2023/0027254 A1 * | 1/2023 | Kim | H01L 25/0753 |
| 2023/0059622 A1 * | 2/2023 | You | H10K 50/816 |
| 2023/0077098 A1 * | 3/2023 | Kim | H10K 59/122 |
| 2023/0143915 A1 * | 5/2023 | Kim | H10K 50/844 257/211 |
| 2023/0146897 A1 * | 5/2023 | Han | H01L 23/544 257/40 |

* cited by examiner

ORGANIC LIGHT-EMITTING DIODE DISPLAY PANELS WITH MOISTURE BLOCKING STRUCTURES

This application claims the benefit of provisional patent application No. 62/788,562, filed Jan. 4, 2019, which is hereby incorporated by reference herein in its entirety.

BACKGROUND

This relates generally to electronic devices, and, more particularly, to electronic devices with displays.

Electronic devices such as cellular telephones, computers, and other electronic devices often contain displays. A display includes an array of pixels for displaying images to a user. In an organic light-emitting diode display, each light-emitting diode has electrodes (i.e., an anode and a cathode). Emissive material is interposed between the anode and cathode electrodes. During operation, current passes between the anode and cathode electrodes through the emissive material to generate light.

A display panel of an electronic device has an active display area within one or more display panel edges. Pixels formed from thin-film circuitry in the active area of the display may be protected using a thin-film encapsulation layer. The thin-film encapsulation layer can help protect the pixels from damage due to environmental exposure. When encapsulation material is used in forming a display, one or more dam structures have to be formed along the display panel edge(s) to contain the encapsulation layer. Formation of the dam structures can, however, increase the display border width. Moreover, in certain display arrangements where the emissive material (which is often an organic layer) extends all the way to the panel edge, there is a risk that moisture can still penetrate into the active area of the display through the organic emissive layer and under the thin-film encapsulation layer, which can severely damage and negatively affect the performance of the display.

SUMMARY

An organic light-emitting diode (OLED) display may include a substrate having a panel edge, thin-film transistor (TFT) layers formed on the substrate, anode and cathode layers formed over the TFT layers, an organic emissive layer that is formed between the anode and cathode layers and that extends from an active area of the display all the way to the panel edge, and an organic emissive layer disconnecting structure formed at least partially through the TFT layers. The organic emissive layer disconnecting structure is configured to prevent moisture permeation through the organic emissive layer into the active area of the display by introducing one or more gaps in the organic emissive layer. The organic emissive layer may be formed via chemical evaporation deposition techniques. Thus, the organic emissive layer disconnecting structure may sometimes be referred to as an evaporation layer gap generation structure.

The organic emissive layer disconnecting structure may include one or more trenches formed at least partially through the TFT layers. In one variation, the trench may have enlarged sidewalls forming overhang portions devoid of organic emissive material. In another variation, the trench may have separately etched undercut portions devoid of organic emissive material. In yet another variation, the trench may have sidewalls with multiple levels of ledges, where portions under each of the ledges is devoid of organic emissive material. If desired, the trench may have undercut/overhang recessed portions formed at the topmost opening of the trench. In other suitable arrangements, the trench may have undercut/overhang recessed portions formed at an intermediate depth between the topmost opening and the bottom of the trench. If desired, the trench may have an undercut portion formed on only one side of the trench.

In general, the organic emissive layer disconnecting structure may be formed between a crack stopper structure and the active area. The crack stopper structure may be configured to prevent cracks from propagating into the display from the panel edge. In other suitable arrangements, the organic emissive layer disconnecting structure may be formed at the very edge of the panel edge beyond the crack stopper structure (if any). In certain embodiments, the organic emissive layer disconnecting structure may also be an island structure having an undercut region that is formed on at least one side of the island structure.

DETAILED DESCRIPTION

Figure 1:
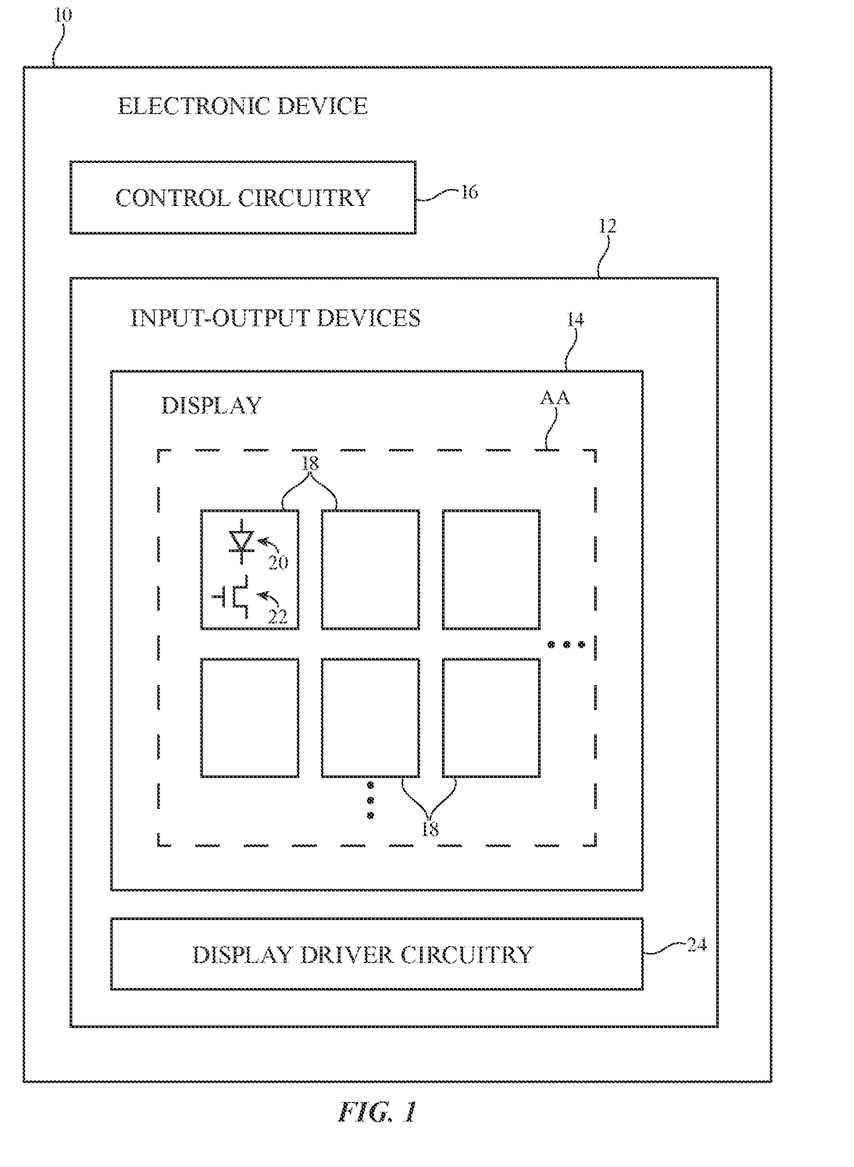
FIG. 1 is a schematic diagram of an illustrative electronic device having a display in accordance with an embodiment.

An illustrative electronic device of the type that may be provided with a display is shown in FIG. 1. Electronic device 10 of FIG. 1 may be a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Display 14 may be an organic light-emitting diode display or other suitable display. Configurations in which display 14 is an organic light-emitting diode display are sometimes described herein as an example.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

As shown in FIG. 1, display 14 may have an array of pixels 18 configured to display images for a user. Pixels 18 may each include one or more thin-film transistors 22 for forming a pixel control circuit and may each include a respective organic light-emitting diode 20 that is controlled by the pixel control circuitry of that pixel 18. Pixels 18 may be formed within an active area AA of display 14. The active area of display 14 may be at least partially surrounded by an inactive border area (sometimes referred to as a display panel edge region). Display driver circuitry 24 may be formed from thin-film transistor circuitry and/or integrated circuit(s) and may be used in supplying image data and control signals to pixels 18 during operation of display 14.

Figure 2:
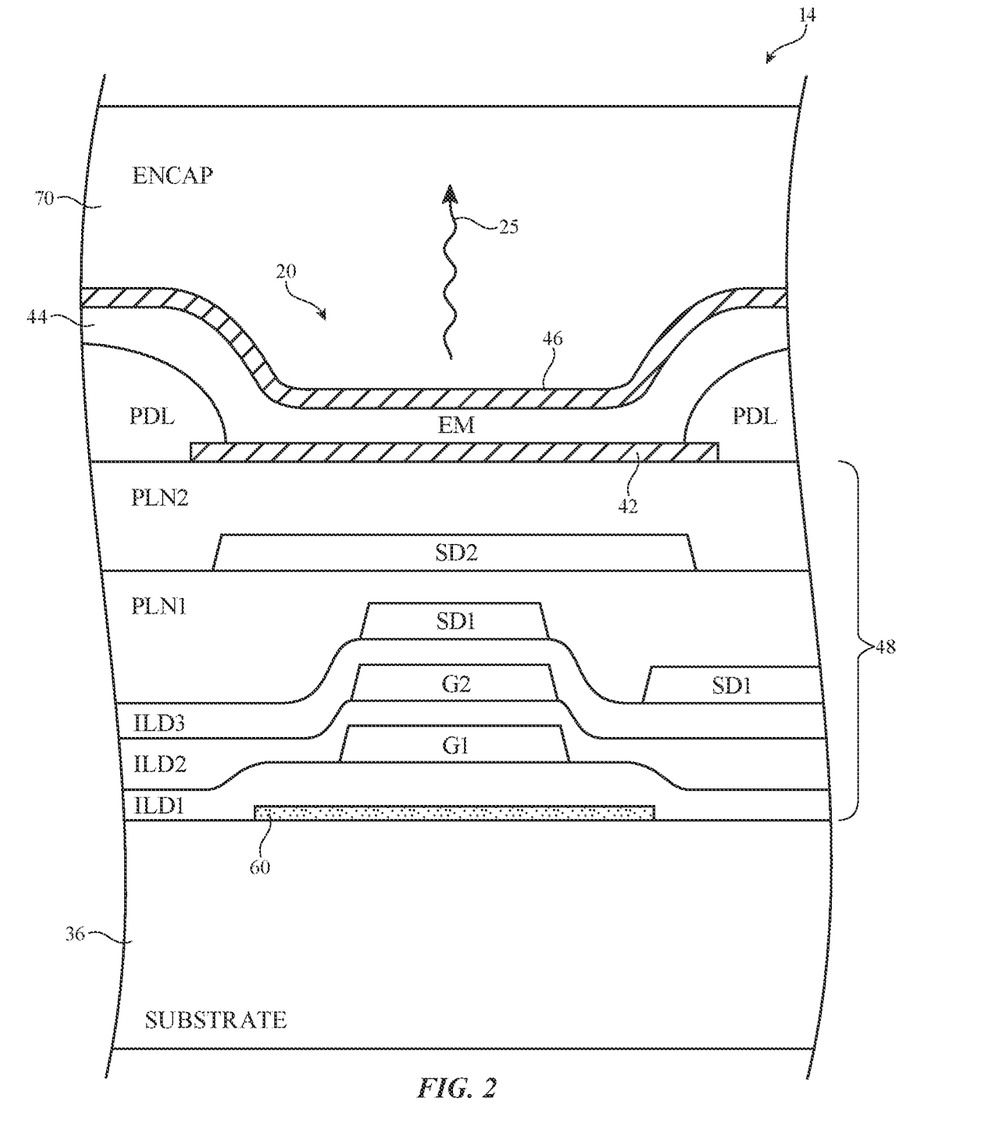
FIG. 2 is a cross-sectional side view of a portion of an illustrative display in accordance with an embodiment.
Figure 3:
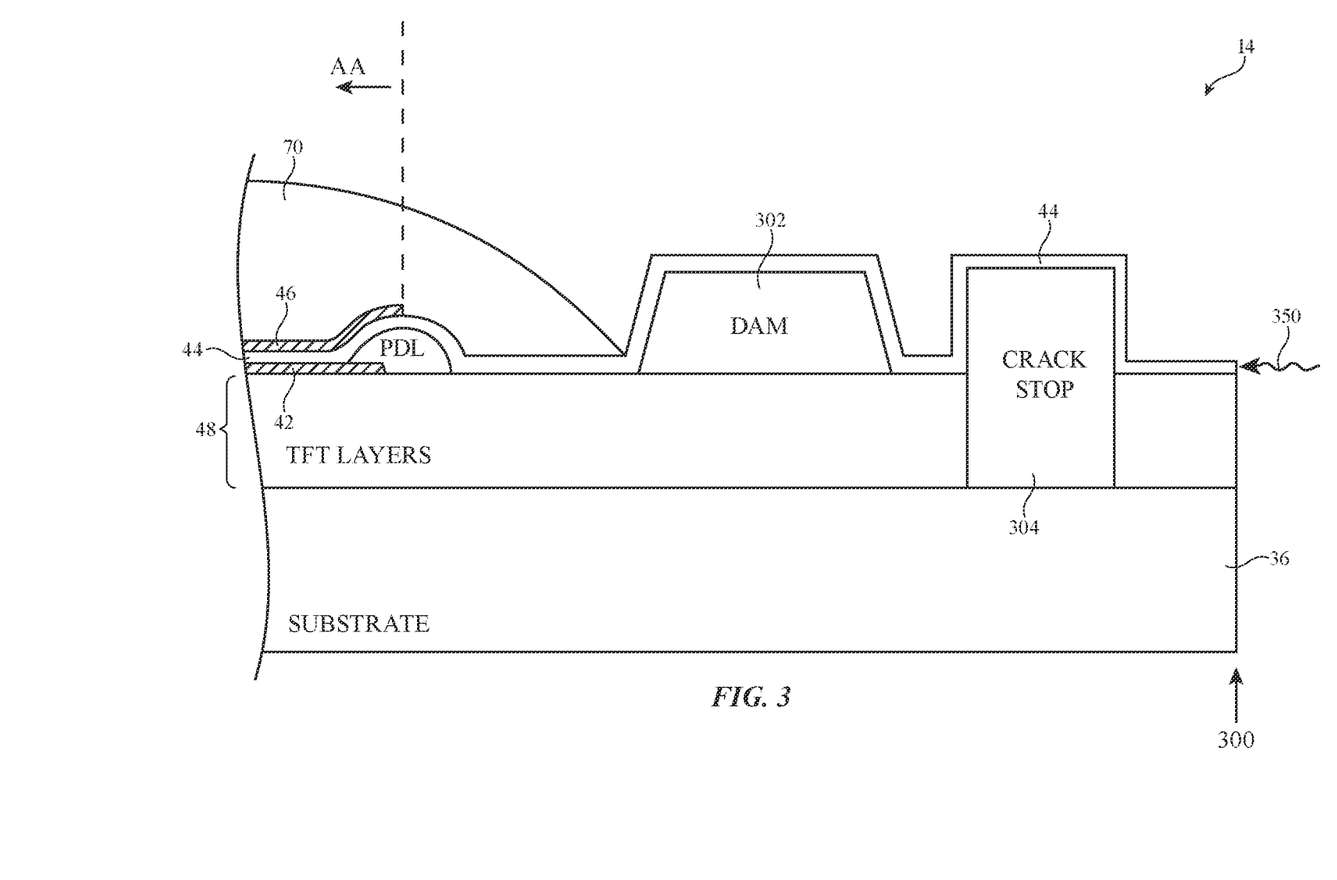
FIG. 3 is a cross-sectional side view of a display edge portion with dam and crack stopper border structures.

A cross-sectional side view of an illustrative organic light-emitting diode display 14 is shown in FIG. 2. As shown in FIG. 2, display 14 may include a substrate layer such as substrate layer 36. Substrate 36 may be a planar layer or a non-planar layer and may be formed from plastic, polymer, glass, ceramic, sapphire, metal, or other suitable substrate materials. In the example of FIG. 3, substrate 36 may be an organic substrate formed from polyimide (PI), polyethylene terephthalate (PET), or polyethylene naphthalate (PEN) (as examples). The surface of substrate 36 may optionally be covered with one or more buffer layers (e.g., inorganic buffer layers such as layers of silicon oxide, silicon nitride, etc.).

Thin-film transistor (TFT) layers 48 that include thin-film transistor circuitry may be formed on substrate 36. The TFT circuitry may include thin-film transistors, capacitors, and other active/passive thin-film structures. Thin-film transistor layers 48 may include a semiconductor layer 60 formed over substrate 36. Semiconductor layer 60 may be a silicon layer such as a low-temperature polysilicon layer, a semiconducting-oxide layer such as a layer of indium gallium zinc oxide (IGZO), or other semiconductor layer that can serve as the channel region for a thin-film transistor. A first interlayer dielectric film ILD1 may be formed over semiconductor layer 60. Gate structures such as first gate conductor G1 may be formed on layer ILD1. Formed in this way, layer ILD1 serves as a gate insulating film. A second interlayer dielectric film ILD2 may be formed over the G1 structures. Additional gate structures such as second gate conductor G2 may be formed on layer ILD2. A third interlayer dielectric film ILD3 may be formed over the G2 structures. In general, the various ILD layers may be formed from inorganic dielectric material such as silicon oxide.

Metal structures such as first source-drain conductors SD1 may be formed on layer ILD3. At least some of the SD1 metal structures may be electrically coupled to semiconductor layer 60 by forming contact holes through the ILD layers to serve as thin-film transistor source-drain terminals. At least some of the semiconductor layer 60, gate structures, and source-drain terminals may be interconnected to serve as one or more thin-film transistors 22 in each pixel 18 (see FIG. 1). A first planarization layer PLN1 formed from organic dielectric material such as polymer may be formed over the SD1 metal structures. Additional metal structures such as second source-drain conductors SD2 may be formed on first planarization layer PLN1. At least some of the SD2 metal structures may be electrically coupled to the underlying thin-film transistor circuitry through one or more vias in layer PLN1. A second planarization layer PLN2 formed from organic dielectric material (e.g., polymer) may be formed over the SD2 metal structures. If desired, a thin-film transistor passivation layer may be formed over the topmost TFT planarization layer.

The layers between substrate 36 and the TFT passivation layer (which include semiconductor layer 60, the various ILD layers, the different gate layers, the different source-drain layers, and the various planarization layers) may sometimes be referred to collectively as TFT layers 48. The example of FIG. 2 in which TFT layers 48 include one semiconductor layer, two different layers of gate conductors, two different layers of source-drain conductors, and two different planarization layers is merely illustrative. If desired, thin-film transistor layers 48 may include two or more layers of semiconductor layer (e.g., a first layer of silicon semiconductor, a second layer of semiconducting-oxide layer above or below the first layer of silicon semiconductor, etc.), only one layer of gate structures or more than two layers of gate structures, only one layer of source-drain structures or more than two layers of source-drain structures, only one planarization layer or more than two planarization layers, or other suitable TFT stack-up.

Organic light-emitting diode structures may be formed on thin-film transistor layers 48. Each light-emitting diode has a lower electrode and an upper electrode. In a "top-emission" display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semi-transparent metal and/or a layer of indium tin oxide or other transparent conductive material). This allows the upper electrode to transmit light outwards that has been produced by emissive material in the diode. In a "bottom-emission"

display, the lower electrode may be transparent (or semi-transparent) and the upper electrode may be reflective.

In configurations in which the anode is the lower electrode, layers such as a hole injection layer, hole transport layer, emissive material layer, electron transport layer, and electron injective layer may be formed above the anode and below the upper electrode, which serves as the cathode for the diode. In inverted configurations in which the cathode is the lower electrode, layers such as an electron injection layer, electron transport layer, emissive material layer, hole transport layer, and hole injection layer may be stacked on top of the cathode and may be covered with an upper layer that serves as the anode for the diode. One or both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 2, display 14 has a top-emission configuration where lower electrode 42 is an anode and upper electrode 46 is a cathode. Anode conductor 42 may be formed within an opening in a pixel definition layer PDL. Pixel definition layer PDL may be formed from a patterned photo-imagable polymer. In each light-emitting diode 20, organic emissive material 44 is interposed between anode layer 42 and cathode layer 46. Anode structures 42 may be patterned from a layer of metal on top of thin-film transistor layers 48. Cathode 46 may be formed from a common conductive layer that is deposited on top of organic emissive layer 44. Cathode 46 is transparent so that light 25 may exit light emitting diode 20 as current flows through emissive material 44 between anode 42 and cathode 46.

Circuitry in the active display area should be protected by thin-film encapsulation layers such as thin-film encapsulation layers 70. Encapsulation layers 70 may, for example, include first and second inorganic encapsulation layers and an organic encapsulation layer sandwiched between the first and second inorganic encapsulation layers. Thin-film encapsulation layers 70 formed in this way can help prevent moisture from damaging the conductive circuitry in display 14.

FIG. 3 is a cross-sectional side view of a display 14 having an edge portion with dam and crack stopper border structures. As shown in FIG. 3, thin-film transistor layers 48 may be formed on substrate 36. Organic light-emitting diode structures such as anode 42 and cathode 46 may be formed within the active area AA of the display in which the pixels form images for viewing by a user of device 10. In conventional displays, whenever thin-film encapsulation layer 70 is being formed as part of the display stack-up, one or more dam structures 302 has to be formed in the inactive area to help contain the organic encapsulation material within layer 70 (i.e., to help prevent the organic encapsulation material from leaking out of the display border edge during formation of encapsulation layers 70). Dam structures 302 are typically formed on TFT layers 48 along the edge of the encapsulation layers 70. Formation of dam structures 302 (which often include two or more protruding barrier structures formed laterally across the surface of TFT layers 48) can, however, increase the inactive border area.

Substrate layer 36 may be formed by cutting a common substrate (e.g., user laser or other inscribing techniques) into multiple display panels. The TFT layers 48 formed on substrate 36, which typically include various inorganic dielectric layers (see, e.g., the different ILD layers in FIG. 2) are prone to cracking as display panels are cut from the common substrate to form display panel edge 300. To prevent cracks and delamination of layers 48, display 14 may be provided with a peripheral crack-stopper structure (sometimes referred to as a crack prevention structure, crack-stopper strip, crack-stopper line, etc.) such as peripheral crack-stopper structure 304. Crack-stopper structure 304 may be used to prevent crack propagation from panel edge 300 and film delamination in the layers of display 14 such as layers 48 and 70. Panel edge 300 might also be formed by constructing a hole at least partially through the display stack-up (as an example), where the hole might be near the peripheral border of display 14 or might be somewhere near the center of display 14 in the active area.

While the thin-film encapsulation layers 70 can generally prevent moisture from penetrating into the active circuitry within display 14, in certain embodiments where the organic emissive layer 44, which is especially conducive to moisture propagation, extends all the way to display panel edge 300 (such as in the exemplary display of FIG. 3), there is a risk that moisture can still permeate into the active area of the display through the organic emissive layer 44, as indicated by arrow 350. Emissive layer 44 may be formed on top of TFT layers 48 over dam structures 302 and crack stopper structure 304 but under thin-film encapsulation layers 70, thereby providing a leakage or bypass path through which moisture can inadvertently seep into the display active area.

Figure 4:
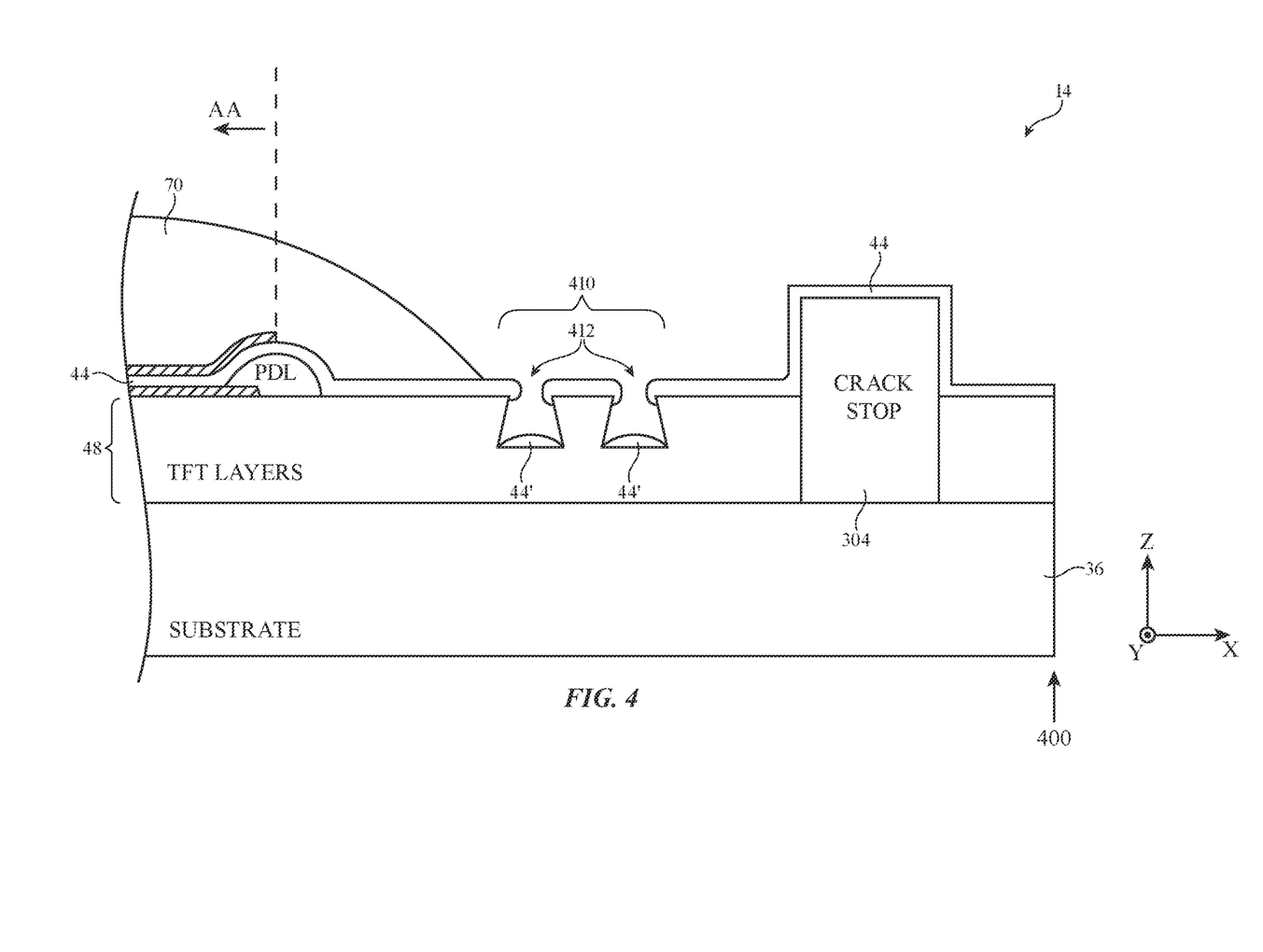
FIG. 4 is a cross-sectional side view of an edge portion of a display panel with illustrative evaporation layer disconnecting structures in accordance with an embodiment.

In accordance with an embodiment, a display 14 is provided with structures that disconnect or sever organic emissive layer 44 in the panel edge region such that any potential moisture permeation path from the actual panel edge is cut off. FIG. 4 is a cross-sectional side view of such display 14 that includes illustrative moisture prevention or moisture blocking structures 410. As shown in FIG. 4, moisture prevention/blocking structures 410 may be formed in place of dam structures 302 between the active area AA of the display and display panel edge 400. Moisture prevention structures 410 may include one or more wells, channels, or trenches 412 such that when the organic emissive layer 44 is formed, at least a portion 44' will be formed at the bottom of trenches 412 such that portion 44' is physically decoupled or detached from layer 44 formed at the top of those trenches 412. Trenches 412 may at least partially surround or completely surround the active circuitry within the active area of display 14 to ensure that any moisture propagation path is terminated. Although not shown, trenches 412 may optionally be filled by non-organic material or other material that is insusceptible to moisture penetration.

Forming one or more physical gaps in the organic emissive layer 44 in this way can help eliminate the risk of any moisture permeation even if emissive layer 44 were to extend all the way to the panel edge 400 as in the arrangement of FIG. 4. Moisture blocking structures 410 can therefore sometimes be referred to as organic emissive layer disconnecting structures, organic emissive layer severing structures, organic emissive layer moisture decoupling structures, or organic emissive layer gap generation structures. As already alluded to above, organic layer disconnecting structures 410 can also replace dam structures 302 to help contain thin-film encapsulation layers 70 within the active area of the display, which reduces the inactive border area at the edge of the display.

Figure 5:
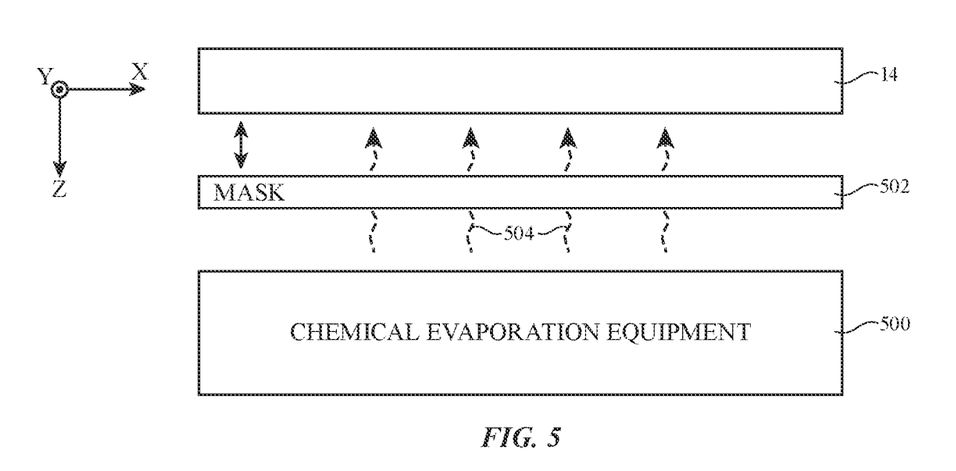
FIG. 5 is a diagram illustrating how an organic layer may be formed on a display panel via evaporation in accordance with an embodiment.

FIG. 5 is a diagram illustrating how organic emissive layer 44 may be formed on display 14 using evaporation equipment. As shown in FIG. 5, the display panel may be oriented face down while chemical evaporation equipment 500 deposits a layer of organic emissive material onto the display panel, as indicated by arrows 504. A mask layer such as an open-face mask 502 may be used to selectively pattern where the organic emissive material is allowed to be dispensed on display 14. In general, the organic emissive material may be deposited on the display using chemical vapor deposition (CVD), physical vapor deposition, vapor phase epitaxy, thermal oxidation, casting, or other types of thin-film deposition processes. Although moisture blocking structures 410 described herein are directed to severing or forming gaps in the organic emissive layer, structures 410 may in general be used to disconnect any potentially problematic organic layer susceptive to moisture permeation in the display stack-up that is formed via evaporation.

Chemical evaporation techniques are limited in the sense that only particular exposed surfaces will be coated assuming the duration and angle of deposition is well-controlled. Organic layer disconnecting structures 410 take advantage of this limitation of the chemical vapor deposition by employing narrow trenches in the thin-film transistor layers 48 such that evaporation will not be able to sufficiently reach or coat the side walls of these narrow trenches. Structures 410 that exploit this particular finding are therefore sometimes referred to as evaporation layer disconnecting structures.

Figure 6:
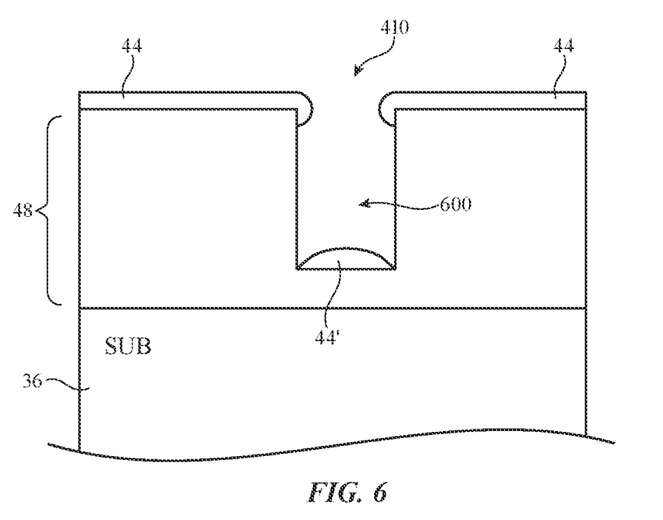
FIGS. 6-11 are cross-sectional side views showing different types of evaporation layer disconnecting structures in accordance with certain embodiments.

FIGS. 6-11 are cross-sectional side views showing different types of evaporation layer disconnecting structures 410. FIG. 6 illustrates a first suitable embodiment in which structure 410 has a narrow trench 600 (sometimes referred to as a recessed portion). Trench 600 may be formed only partially through TFT layers 48 (e.g., trench 600 may cut through any number of planarization, metal, gate, and/or dielectric layers in the TFT layers 48) or may be formed all the way through the TFT layers 48 (i.e., so that trench 600 traverses entirely through layers 48). Trench 600 should be configured with the proper width and depth such that only a small portion of emissive material 44' will be formed at the bottom of trench 600 while the sidewalls of trench 600 are devoid of any organic emissive material. By ensuring that the sidewalls of trench 600 are not deposited with any organic emissive material, structure 410 introduces physical gaps in organic emissive layer 44, which cuts off or terminates any potentially problematic moisture permeation path.

Figure 7:
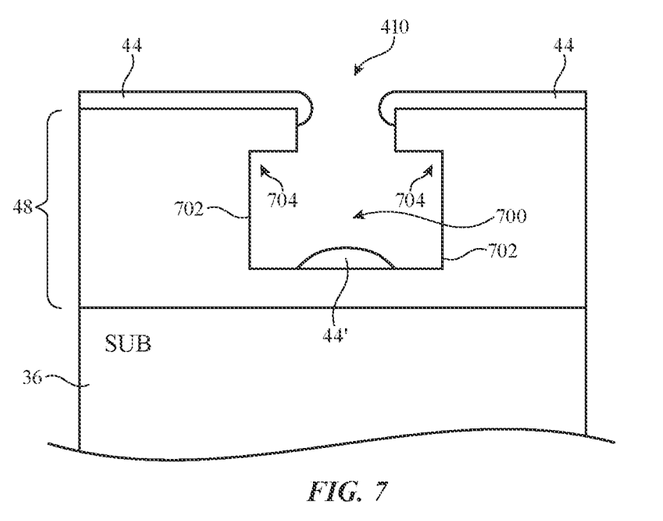

FIG. 7 illustrates another suitable embodiment in which structure 410 has a narrow trench 700 with enlarged sidewalls. Trench 700 may extend only partially or all the way through TFT layers 48. Trench 700 should be configured with the proper width and depth such that only a small portion of emissive material 44' will be formed at the bottom of trench 700 while the sidewalls of trench 700 are devoid of any organic emissive material. As shown in FIG. 7, the trench sidewalls 702 may be further etched way so as to create an undercut 704 at the opening of trench 700. The undercut shape may also be referred to as an overhang. The final depth of trench 700 and the undercut sidewalls 702 may be simultaneously formed using the same etchant. The formation of the trench overhang can further guarantee that no evaporated emissive material will be deposited in the undercut region 704, thereby terminating any potentially problematic moisture permeation path.

Figure 8A:
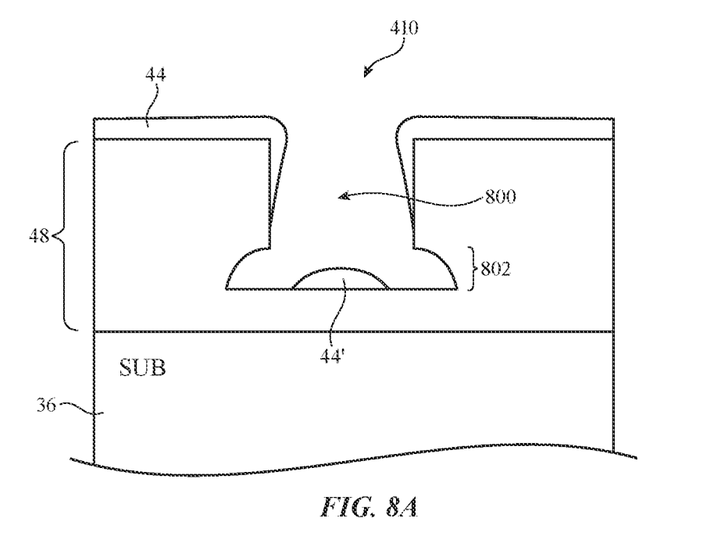

FIG. 8A illustrates yet another suitable embodiment in which structure 410 has a trench 800 with an undercut portion 802 formed using a separate etching operation. Trench 800 may extend only partially or all the way through TFT layers 48. Trench 800 may be relatively wider than trench 600 of FIG. 6 or trench 700 of FIG. 7 and thus, at least some emissive material may extend downwards into trench 800. The amount of emissive material that is deposited on the sidewalls should be kept to a minimum, if possible. The undercut portion 802, however, will ensure that the small amount of emissive material 44' at the bottom of trench 800 is completely disconnected from the emissive material above.

Figure 8B:
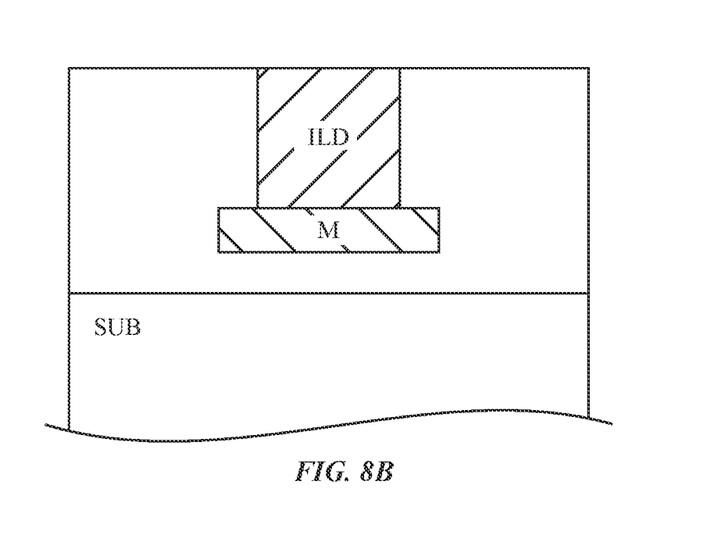

The undercut portion 802 may be formed using a separate etchant. FIG. 8B illustrates how structure 410 may initially be filled by at least two different types of material. As shown in FIG. 8B, prior to forming the organic emissive later, trench 800 may initially be filled by dielectric material ILD and metal M. The dielectric material ILD may be removed using a first etchant that selectively targets the dielectric material without etching the metal. Thereafter, the metal M may be removed using a second etchant that selectively targets the metal material without etching the dielectric. Using a separate etchant to create undercut portion 802 in this way provides enhanced selectivity. This helps ensure that undercut portion 802 has the proper shape so that no organic emissive material will be deposited therein, thereby terminating any potentially problematic moisture permeation path.

Figure 9:
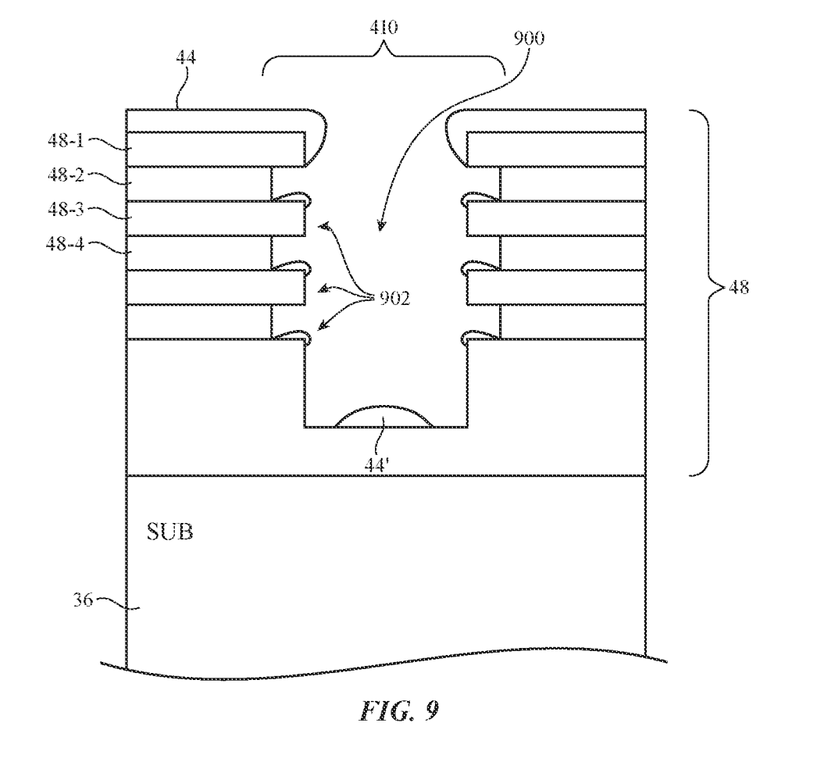

FIG. 9 illustrates another suitable arrangement that includes multiple layers of undercut. As shown in FIG. 9, structure 410 may include a trench 900 having sidewalls with multiple levels of undercut/overhang portions. Trench 900 may extend only partially or all the way through the TFT layers 48. The TFT layers 48 may generally include layers of alternating material. As an example, TFT layers 48-1 and 48-3 may be silicon oxide layers, whereas TFT layers 48-2 and 48-4 may be silicon nitride layers. These alternating layers may have different etch rates or may be etched using different etchants to create the multi-level undercut sidewall configuration of FIG. 9. A small amount of emissive material 44' may be deposited at the bottom of trench 900. While a small amount of emissive material might be formed at the multiple levels of sidewall ledges (see portions 902), the undercut region below each ledge/overhang should be completely devoid of any evaporated organic emissive material.

In the example of FIG. 9, three undercut regions are formed vertically with respect to one another, which is merely illustrative. In general, structure 410 may include sidewalls having only two stacked undercut portions, more than three stacked undercut portions, 4-10 vertically stacked undercut/overhang portions, or any suitable number of ledges. The multi-layer undercut configuration of FIG. 9 creates multiple opportunities to disconnect or sever organic emissive layer 44, thereby eliminating any potentially problematic moisture permeation path.

Figure 10:
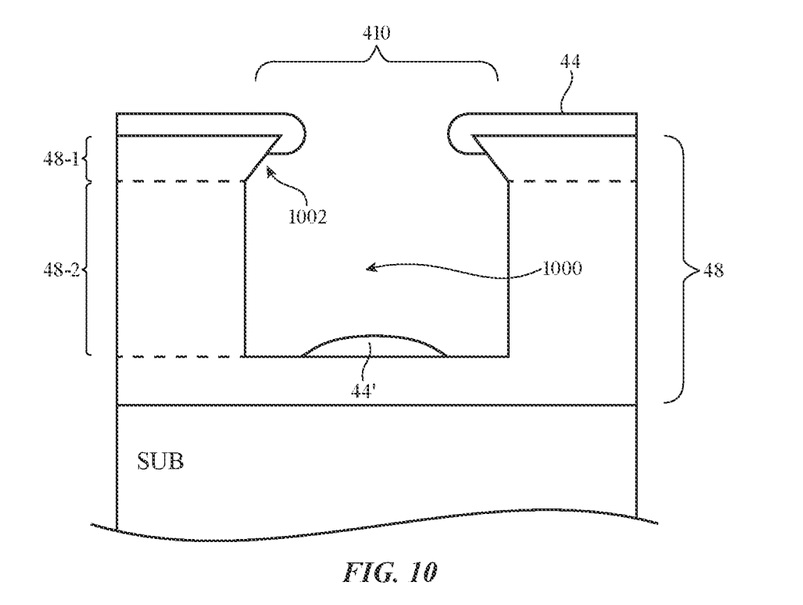

FIG. 10 illustrates yet another example in which structure 410 has a trench 1000 having upper layers 48-1 that form the requisite undercut portion and lower layers 48-2 that form the rest of trench 1000. In particular, upper layers 48-1 may include multiple layers of stacked metals each with a different etch rate. Thus, a single etching operation can be used to simultaneously etch away the multiple layers of metals 48-1 to create the undercut portion 1002.

Figure 11:
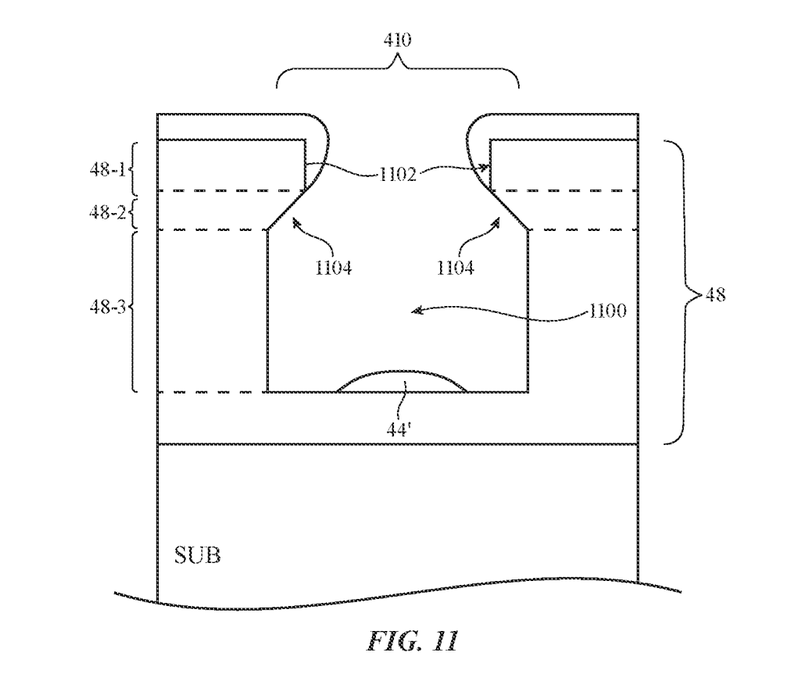

The configuration of FIG. 10 in which the uppermost portion 48-1 is partially etched away may cause emissive material to accumulate at the lip of the trench opening during evaporation, which may subject that portion to potential cracking. FIG. 11 illustrates another suitable embodiment in which structure 410 has a trench 1100 having upper layers 48-1 having straight sidewalls 1102, middle layers 48-2 that form the requisite undercut portion, and lower layers 48-3 that form the rest of trench 1100. The vertical sidewalls 1102 provide a more robust trench opening that is less prone to cracks. While some emissive material might coat sidewalls 1102 near the opening of trench 1100, the undercut portion 1104 in layers 48-2 will be devoid of any evaporated organic emissive material. As an example, layers 48-2 may include multiple layers of stacked metals each with a different etch rate. Thus, a single etching operation can be used to simultaneously etch away the multiple layers of metals 48-2 to create the undercut portion 1104.

Figure 12:
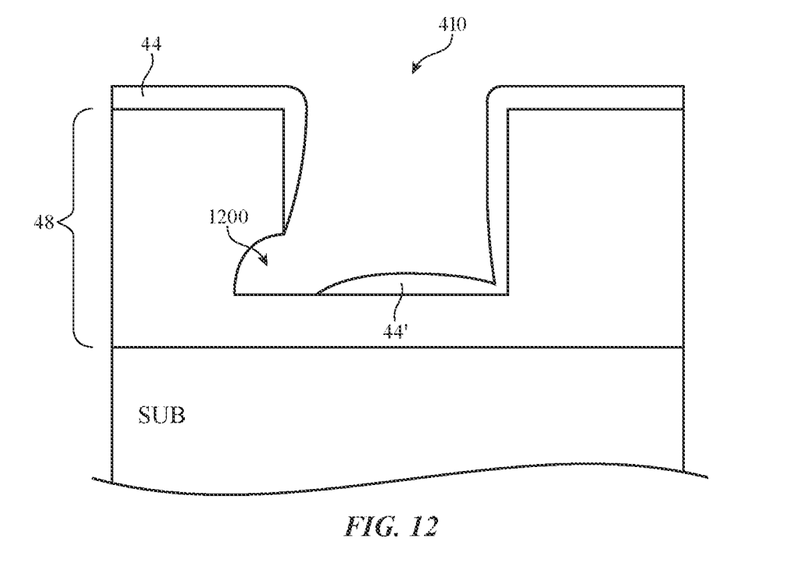
FIGS. 12 and 13 are cross-sectional side views of illustrative single-sided evaporation layer disconnecting structures in accordance with some embodiments.
Figure 13:
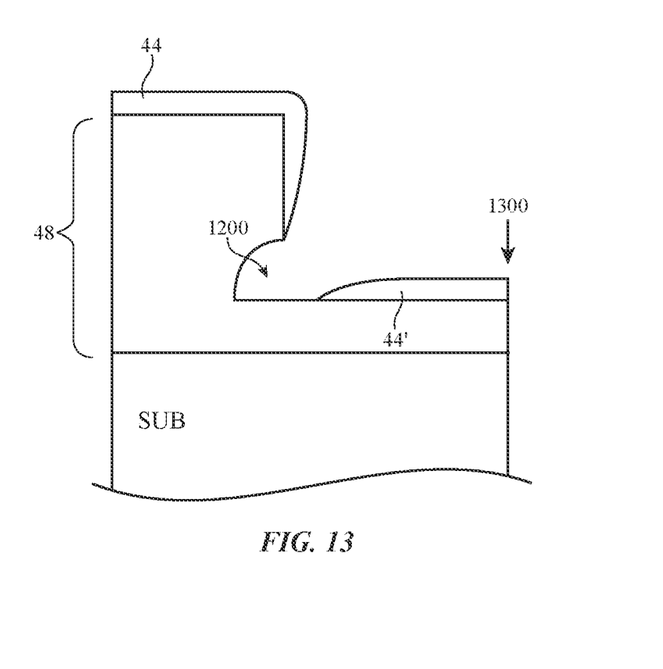

The examples of FIGS. 6-11 where the emissive material is disconnected from both or all sides of the trench are merely illustrative. FIG. 12 shows how organic evaporation disconnecting structure 410 has undercut portion 1200 formed on only one side of the trench. As shown in FIG. 12, the emissive material 44' at the bottom of the trench might be connected (from the right side) to the emissive layer 44 formed on the top surface of layers 48 but will still be disconnected on the left side due to undercut portion 1200. As long as there is a gap on at least one side of the trench, the moisture permeation path via organic emissive layer 44 will be completely disconnected. In certain embodiments, this single-sided undercut structure can optionally be implemented near the panel edge (see, e.g., FIG. 13). As shown in FIG. 13, the disconnected or isolated emissive material 44' may extend all the way to the display panel edge 1300, and the undercut portion 1200 on the other end will prevent any physical contact between emissive material 44' and the emissive layer 44 extending from the left. Undercut portion 1200 of FIG. 13 may sit outside the crack stopper structure 44, if it exists (see FIG. 4).

Figure 14A:
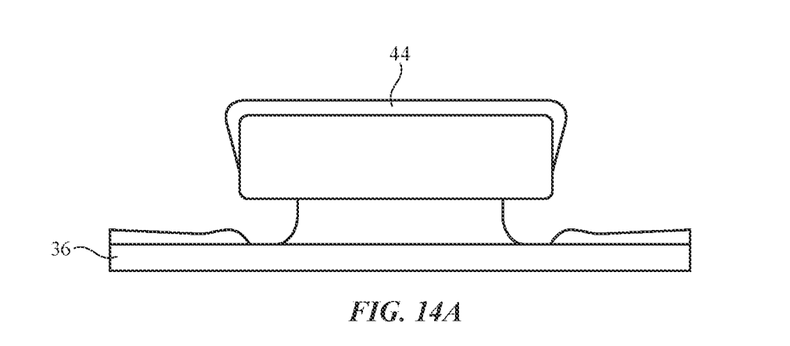
FIGS. 14A, 14B, and 14C are cross-sectional side views of illustrative island structures with undercut on both sides in accordance with certain embodiments.
Figure 14B:
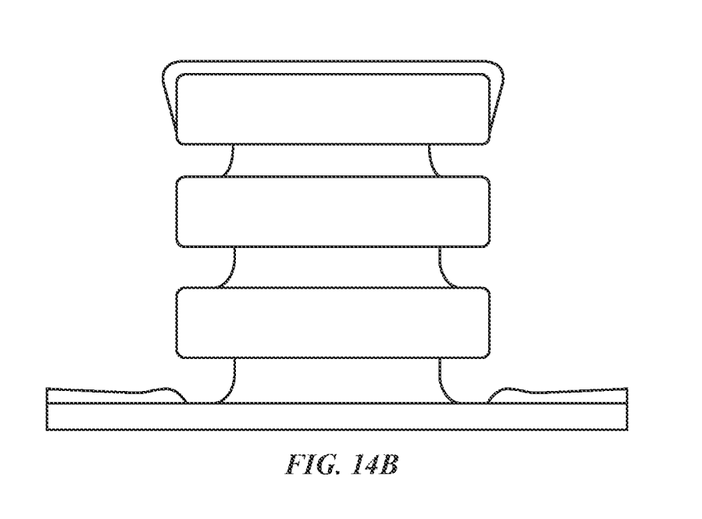
Figure 14C:
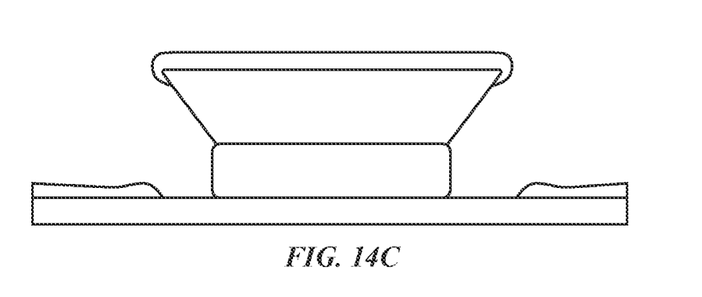

The examples of FIGS. 6-12 in which the organic emissive layer disconnecting structure 410 includes only trenches formed in the TFT layers 48 are merely illustrative. FIGS. 14A, 14B, and 14C are cross-sectional side views showing how the organic emissive layer may also be disconnected using island structures having undercut or overhang portions on one or both sides of the island. FIG. 14A shows a first exemplary configuration in which an island is formed by etching undercut regions of the type described in connection with FIG. 8A. FIG. 14B shows another exemplary configuration in which an island is formed by constructing multiple undercut ledges of the type described in connection with FIG. 9. FIG. 14C shows yet another exemplary configuration in which an island can be formed by etching undercut regions of the type described in connection with FIG. 10. If desired, one or more island structures can be constructed by forming any type of undercut regions on either side of the island such that the organic emissive material deposited on the island is disconnected from the emissive layer extending from the left or right side of the display panel.

Referring back to the example of FIG. 4, a display 14 may include moisture blocking structures 410 having at least two organic evaporation layer disconnecting trenches. This is merely illustrative and is not intended to limit the scope of the present embodiments. If desired, structures 410 may include only one trench, two trenches, or more than two trenches, which can be formed between the active area of the display and the crack stopper structure (as shown in the configuration of FIG. 4) or can optionally be formed at the display panel edge (as shown in the configuration of FIG. 13). In the scenario where multiple trenches are formed, the trenches may be of the same type (e.g., both trenches may have the identical trench structure selected from any one of FIGS. 6-12) to simplify the manufacturing process or may be of disparate types (e.g., a first trench may have the trench structure of FIG. 8A, whereas a second trench may have the trench structure of FIG. 9) to further ensure that the emissive layer 44 is disconnected by one or more gaps. If desired, one or more island structures such as the isolated island structures of FIGS. 14A, 14B, and 14C can be formed in the panel edge region to help terminate any potential moisture permeation path. The various organic evaporation layer disconnecting structures of the type described in connection with FIGS. 6-14 are not mutually exclusive and can optionally be combined in a single electronic device display 14.

The foregoing is merely illustrative and various modifications can be made to the described embodiments. The foregoing embodiments may be implemented individually or in any combination.

What is claimed is:

1. A display, comprising:
a substrate having a panel edge;
thin-film transistor (TFT) layers formed on the substrate, wherein organic light-emitting diode display pixel structures are formed in the TFT layers within an active area of the display;
anode and cathode layers formed over the TFT layers;
organic emissive material with a first portion that is formed between the anode and cathode layers and with a second portion that extends to the panel edge;
an organic emissive layer disconnecting structure formed at least partially through the TFT layers and disposed between the first portion of the organic emissive material and the second portion of the organic emissive material, wherein the organic emissive layer disconnecting structure is configured to create a gap that physically detaches the first portion of the organic emissive material from the second portion of the organic emissive material; and
a crack stopper structure formed on the substrate, wherein the crack stopper structure is configured to prevent cracks from propagating into the display from the panel edge, wherein the crack stopper structure is formed in the TFT layers and extends above the TFT layers, and wherein the organic emissive material is formed over the crack stopper structure.

2. The display of claim 1, wherein the organic emissive layer disconnecting structure is configured to create one or more additional gaps that physically detach the first portion of the organic emissive material from the second portion of the organic emissive material.

3. The display of claim 1, wherein the organic emissive layer disconnecting structure is formed only partially through the TFT layers.

4. The display of claim 1, wherein the organic emissive layer disconnecting structure comprises a trench formed at least partially through the TFT layers.

5. The display of claim 4, wherein the trench has enlarged sidewalls forming overhang portions devoid of the organic emissive material.

6. The display of claim 4, wherein the trench has separately etched undercut portions devoid of the organic emissive material.

7. The display of claim 4, wherein the trench has sidewalls with multiple levels of ledges and wherein portions under each of the ledges are devoid of the organic emissive material.

8. The display of claim 4, wherein the trench has an undercut portion formed at a topmost opening of the trench.

9. The display of claim 4, wherein the trench has an undercut portion formed at an intermediate position between a topmost opening of the trench and a bottom of the trench.

10. The display of claim 4, wherein the trench has an undercut portion formed on only one side of the trench.

11. The display of claim 1, wherein the organic emissive layer disconnecting structure comprises a plurality of trenches formed at least partially through the TFT layers.

12. The display of claim 1, wherein the organic emissive layer disconnecting structure comprises an island structure having an undercut region that is formed on at least one side of the island structure and that is devoid of the organic emissive material.

13. A display, comprising:
- a substrate;
- thin-film transistor layers formed over the substrate;
- a light emissive layer formed over the thin-film transistor layers; and
- a moisture blocking structure formed at least partially through the thin-film transistor layers, wherein the moisture blocking structure is configured to introduce one or more gaps in the light emissive layer to disconnect respective portions of light emissive material in the light emissive layer from each other, wherein the moisture blocking structure comprises a trench formed at least partially through the thin-film transistor layers, wherein the thin-film transistor layers comprise alternating layers of two different dielectric materials, and wherein the trench comprises a sidewall having overlapping undercut portions formed in the alternating layers of two different dielectric materials.

14. The display of claim 13, wherein the overlapping undercut portions are devoid of the light emissive material.

15. The display of claim 13, wherein the light emissive layer is configured to generate light when current passes through the light emissive layer.

16. A display having an active area and an edge region, comprising:
- a substrate;
- thin-film transistor (TFT) layers formed on the substrate;
- an organic layer having a first portion formed on the TFT layers at the active area and having a second portion formed on the TFT layers at the edge region;
- a disconnecting structure at the edge region formed at least partially through the TFT layers, wherein the disconnecting structure is configured to sever the first portion of the organic layer from the second portion of the organic layer and wherein the disconnecting structure comprises a trench formed only partially through the TFT layers; and
- a crack stopper structure formed on the substrate, wherein the crack stopper structure is configured to prevent cracks from propagating into the display through the edge region and wherein the disconnecting structure is interposed between the crack stopper structure and the active area of the display.

17. The display of claim 16, wherein the display has a rectangular footprint, and the edge region runs along at least one peripheral edge of the rectangular footprint.

18. The display of claim 16, wherein the organic layer is an organic emissive layer configured to generate display light.

19. The display of claim 1, wherein the crack stopper structure is between the organic emissive layer disconnecting structure and the active area of the display.

* * * * *